United States Patent [19]

Koike et al.

[11] Patent Number: 4,950,581
[45] Date of Patent: Aug. 21, 1990

[54] PHOTOPOLYMERIZABLE COMPOSITION

[75] Inventors: Mitsuru Koike; Nobuyuki Kita, both of Shizuoka, Japan

[73] Assignee: Fuji Photo Film Co., Ltd., Minami-ashigara, Japan

[21] Appl. No.: 215,353

[22] Filed: Jul. 5, 1988

[30] Foreign Application Priority Data

Jul. 6, 1987 [JP] Japan .................. 62-168194

[51] Int. Cl.$^5$ ............................................. G03C 1/68
[52] U.S. Cl. .................................. 430/281; 430/283; 430/286; 430/913; 430/915; 430/916; 430/919; 430/920; 430/925; 522/15; 522/24; 522/25; 522/121
[58] Field of Search ............... 430/138, 281, 915, 339, 430/913, 916, 283, 286, 919, 920, 925; 522/24, 15, 25, 121

[56] References Cited

U.S. PATENT DOCUMENTS

| | | |
|---|---|---|
| 4,320,189 | 3/1982 | Taguchi et al. |
| 4,636,459 | 1/1987 | Kawamura et al. |
| 4,772,530 | 9/1988 | Gottschalt et al. ............ 430/281 |
| 4,772,541 | 9/1988 | Gottschalt et al. ............ 430/281 |
| 4,880,149 | 1/1989 | Gottschalt et al. ............ 430/281 |

FOREIGN PATENT DOCUMENTS 223587 5/1987 European Pat. Off.

Primary Examiner—Jack P. Brammer
Attorney, Agent, or Firm—Burns, Doane, Swecker & Mathis

[57] ABSTRACT

A photopolymerizable composition is provided containing a polymerizable compound having an ethylenically unsaturated bond, a photopolymerization initiator, and if necessary, a linear organic high molecular weight polymer. The photopolymerization initiator comprises a combination of (a) an organic compound represented by formula (I):

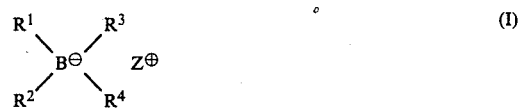

wherein $R^1$, $R^2$, $R^3$, and $R^4$, which may be the same or different, each represents a substituted or unsubstituted alkyl group, a substituted or unsubstituted aryl group, a substituted or unsubstituted alkenyl group a substituted or unsubstituted alkynyl group, or a substituted or unsubstituted heterocyclic group, and at least two of said $R^1$, $R^2$, $R^3$, and $R^4$ may combine to form a cyclic structure, with the proviso that at least one of $R^1$, $R^2$, $R^3$, and $R^4$ is an alkyl group, and wherein $Z^\oplus$ represents an alkali metal cation or a quaternary ammonium cation, and (b) an organic dye having no counter anion.

27 Claims, No Drawings

PHOTOPOLYMERIZABLE COMPOSITION

FIELD OF THE INVENTION

The present invention relates to a photopolymerizable composition. More particularly, the present invention relates to a photopolymerizable composition containing a polymerizable compound having an ethylenically unsaturated bond, a photopolymerization initiator having a novel composition, and if necessary, a linear organic high molecular weight polymer.

BACKGROUND OF THE INVENTION

It is known to reproduce images by photographic means using a photosensitive composition composed of a mixture of a polymerizable compound having an ethylenically unsaturated bond, a photopolymerization inhibitor. As described in U.S. Pat. Nos. 2,927,022, 2,902,356, and 3,870,524, since the above-described type of photosensitive composition upon photopolymerization by irradiation of light is hardened and insolubilized, by forming a proper film or layer of the photosensitive composition, light-exposing the film or layer through a desired negative, and removing unexposed portions only by a proper solvent (hereinafter referred to as "development"), desired hardened images of the photosensitive composition can be formed. Such a photosensitive composition is, as a mater of course, very useful for making printing plates, etc.

Also, since a polymerizable compound having an ethylenically unsaturated bond itself does not have sufficient photosensitivity, it has previously been proposed to add thereto a photopolymerization initiator for increasing the photosensitivity. Examples of such photopolymerization initiators include benzyl, benzoin, benzoin ethyl ether, Michler's ketone, anthraquinone, acridine, phenazine, benzophenone, and 2-ethylanthraquinone.

In the past, however, when the above-described conventional-type photopolymerization initiators have been used, the photopolymerizable composition has shown low responsiveness to hardening. Furthermore, image exposure for forming images requires a long period of time. Accordingly, when precise images are to be formed, if the operation is accompanied by a slight vibration, images having good image quality are not reproduced. Furthermore, the radiation amount of light energy for light exposure must be increased, which results in the formation of large amounts of heat. There is also a problem with the formation of heat in that a film of the photosensitive composition may be deformed or the quality thereof may be adversely affected.

Also, with these photopolymerization initiators, the photopolymerizing faculty thereof by a light source having a visible light region of longer than 400 nm. is remarkably lower than the photopolymerizing faculty thereof by a light source having an ultraviolet region of shorter than 400 nm. Accordingly, with a photopolymerizable composition containing conventional-type photopolymerization initiators, the application range has been greatly limited.

With regard to photopolymerization systems responsive to visible light, various attempts have been proposed. For example, U.S. Pat. No. 2,850,445 indicates that a certain types of photoreducible dyes such as rose bengal, eosin, and erythrosine have effective visible light respondence. Furthermore, there has been proposed as improved techniques, a composite initiation system composed of a dye and an amine (See Japanese Patent Publication No. 20189/69); a system composed of hexaaryl-bi-imidazole, a radical generating agent, and a dye (See Japanese Patent Publication No. 37377/70); a system composed of hexaaryl-bi-imidazole and p-dialkylaminobenzylidene ketone (See Japanese Patent Application (OPI) Nos. 2528/72 and 155292/79); a system composed of a 3-keto-substituted coumarin compound and an active halogen compound (See Japanese Patent Application (OPI) No. 15503/83); and a system composed of a substituted triazine and a merocyanine dye (See Japanese Patent Application (OPI) No. 151024/79). The term "OPI" as used herein indicates an "unexamined published application".

These techniques are certainly effective with visible light. However, the photosensitive speed thereof is still unsatisfactory and further improvements are desired.

Recently, a method of increasing the sensitivity to ultraviolet rays and a method of forming images using a laser have been investigated. Also, a UV projection exposure method for use in making printing plates, making a direct printing plate by laser, laser facsimile, and photography, have already been practically employed. High-sensitive photosensitive materials for these methods have been developed. However, the sensitivity of these photosensitive materials is still unsatisfactory.

SUMMARY OF THE INVENTION

The primary object of the present invention therefore, is to provide a high-sensitive photopolymerizable composition. That is, to provide a photopolymerizable composition containing photopolymerization initiator capable of increasing the photopolymerization speed of a general photopolymerizable composition containing a polymerizable compound having an ethylenically unsaturated bond.

As the result of various investigations directed to attaining the above object, the inventors have unexpectedly discovered that a particular photopolymerization initiator system greatly increases the photopolymerization speed of a polymerizable compound having an ethylenically unsaturated bond and gives a high-sensitive photopolymerizable composition.

According to the present invention, there is provided a photopolymerizable composition containing (i) an addition polymerizable compound having at least one ethylenically unsaturated double bond, (ii) a photopolymerization initiator, and, optionally, (iii) a linear organic high molecular weight polymer, wherein said photopolymerization initiator comprises a combination of (a) a compound represented by formula (I):

wherein $R^1$, $R^2$, $R^3$, and $R^4$, which may be the same or different, each represent a substituted or unsubstituted alkyl group, a substituted or unsubstituted aryl group, a substituted or unsubstituted alkenyl group, a substituted or unsubstituted alkynyl group, or a substituted or unsubstituted heterocyclic group, and two or more of said $R^1$, $R^2$, $R^3$ and $R^4$ may combine with each other to form a cyclic structure, with the proviso that at least one of $R^1$, $R^2$, $R^3$ and $R^4$ is an alkyl group, and wherein $Z^\oplus$ represents an alkali metal cation or a quaternary ammonium cation, and (b) an organic dye having no counter anion.

DETAILED DESCRIPTION OF THE INVENTION

Polymerizable compounds having an ethylenically unsaturated bond which are useful in the present invention, are compounds having at least one ethylenically unsaturated bond in the chemical structure thereof. For example, the aforesaid compound has a chemical mode such as a monomer or a prepolymer, i.e., a dimer, a trimer, or an oligomer, or a mixture thereof and copolymers thereof.

Examples of suitable monomers and the copolymer thereof include esters of unsaturated carboxylic acids and aliphatic polyhydric alcohol compounds, and amides of unsaturated carboxylic acids and aliphatic polyhydric amine compounds.

Specific examples of monomers of the esters of aliphatic polyhydric alcohol compounds and unsaturated carboxylic acids include an acrylic acid ester, such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipehtaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer, etc.

Specific examples also include monomers of methacrylic acid esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis-[p-(3-methacryloxy-2-hydroxypropoxy)phenyl]dimethylmethane, bis[p-(acryloxyethoxy)phenyl]dimethylmethane, etc.

Specific examples further include monomers of itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, etc.

Also, specific examples include monomers of crotonic acid esters such as ethylene glycol dicrotonate, tetramethylene glycol dicrotonate, pentaerythritol dicrotonate, and sorbitol tetradicrotonate.

Specific examples include monomers of isocrotonic acid esters such as ethylene glycol diisocrotonate, pentaerythritol diisocrotonate, sorbitol tetraisocrotonate, etc.

In addition, specific examples include monomers of maleic acid esters are ethylene glycol dimaleate, triethylene glycol dimaleate, pentaerythritol dimaleate, sorbitol tetramaleate, etc.

Mixtures of the aforesaid ester monomers can be also used.

Suitable, specific monomers of the amides of an aliphatic polyhydric amine compound and an unsaturated carboxyolic acids include methylene-bis-acrylamide, methylene-bis-methacrylamide, 1,6-hexamethylene-bis-acrylamide, 1,6-hexamethylenebis-methacrylamide, diethylenetriamine-tris-acrylamide, xylylene-bis-acrylamide, and xylylene-bis-methacryamide.

Another examples of polymerizable compounds having an ethylenically unsaturated bond are vinylurethane compounds having two or more polymerizable vinyl groups in one molecule obtained by adding a vinyl monomer having a hydroxy group shown by following formula (A) to a polyisocynate compound having two or more isocyanate groups in one molecule such as those described in Japanese Patent Publication No. 41708/73;

CH$_2$=0 C(R)COOCH$_2$CH$_2$CH(R')OH (A)

wherein R and R' each represent a hydrogen atom or a methyl group.

Also, still other examples thereof include polyfunctional acrylates and methacrylates, such as urethane acrylates such as those described in Japanese Patent Application (OPI) No. 37193/76, polyester acrylates such as those described in Japanese Patent Application (OPI) No. 64183/73 and Japanese Patent Publication Nos. 43191/74 and 30490/77, and epoxy acrylates which may be obtained by reacting epoxy resins and (meth)acrylic acid.

Furthermore, light-hardenable monomers and oligomers such as those described in *Nippon Setchaku Kyokai Shi (Journal of Adhesive Society of Japan)*, Vol. 20, No. 7 pp.300–308 can be also used.

The amount of monomer having at least one ethylenically unsaturated group may be from 5 to 50% by weight, and is preferably from 10 to 40% by weight based on the total weight of the composition.

The photopolymerization initiator used in the present invention is an organic boron compound. The organic boron compound is represented by formula (I)

$$\begin{array}{c} R^1 \\ \diagdown \\ R^2 \end{array} B^{\ominus} \begin{array}{c} R^3 \\ \diagup \\ R^4 \end{array} \quad Z^{\oplus} \quad (I)$$

wherein $R^1$, $R^2$, $R^3$ and $R^4$, which may be the same or different, each represents a substituted or unsubstituted alkyl group, a substituted or unsubstituted aryl group, a substituted or unsubstituted alkenyl group, a substituted or unsubstituted alkynyl group, or a substituted or unsubstituted heterocyclic group, and two or more of said $R^1$, $R^2$, $R^3$ and $R^4$ may combine with each other to form a cyclic structure, with the proviso that at least one of $R^1$, $R^2$, $R^3$ and $R^4$ is an alkyl group, and wherein $Z^{\oplus}$ represents an alkali metal cation or a quaternary ammonium cation.

An alkyl group represented by $R^1$ to $R^4$ includes a straight, branched or cyclic alkyl group and preferably has 1 to 18 carbon atoms, such as a methyl group, an ethyl group, a propyl group, an isopropyl group, a butyl group, a pentyl group, a hexyl group, an octyl group, a stearyl group, a cyclobutyl group, a cyclopentyl group, a cyclohexyl group, etc.

A substituted alkyl group represented by $R^1$ to $R^4$ includes an alkyl group described above having a substituent, such as a halogen atom, e.g., a chlorine atom, a bromine atom, etc.; a cyano group; a nitro group; an aryl group, preferably, a phenyl group; a hydroxyl group; a —N=$R^5R^6$ group, wherein $R^5$ and $R^6$ each represents a hydrogen atom, an alkyl group having 1 to 14 carbon atoms or an aryl group; a —COOR$^7$ group, wherein $R^7$ represents a hydrogen atom, an alkyl group having 1 to 14 carbon atoms or aryl group; a —OCOR$^8$ group or a —OR$^8$ group, wherein $R^8$ represents an alkyl group having 1 to 14 carbon atoms or an aryl group.

An aryl group represented by $R^1$ to $R^4$ includes an aryl group having 1 to 3 rings, such as a phenyl group, a naphthyl group, etc., and a substituted aryl group represented by $R^1$ to $R^4$ includes an aryl group described above having the same substituent as that for the alkyl group or an alkyl group having 1 to 14 carbon atoms.

An alkenyl group represented by $R^1$ to $R^4$ includes a straight, branched or cyclic alkenyl group having 2 to 18 carbon atoms and a substituent for the alkenyl group includes the same substituent as that for the alkyl group.

An alkynyl group represented by $R^1$ to $R^4$ includes a straight or branched alkynyl group having 2 to 18 carbon atoms, and a substituent for the alkynyl group includes the same substituent as that for the alkyl group.

A heterocyclic group represented by $R^1$ to $R^4$ includes a 5 or more-membered ring, preferably 5 to 7-membered ring containing at least one atom selected from the group consisting of N, S and O, and the heterocyclic ring may contain a condensed ring. The substituent for the heterocyclic group includes the same substituent as that for the aryl group.

Examples of such organic boron compounds are the compounds illustrated by the following formulae (a) to (f) and the compounds described in U.S. Pat. Nos. 3,567,453 and 4,343,891, and European Patent Nos. 109,772 and 109,773:

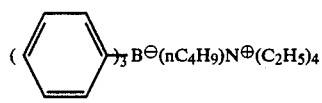

(a)

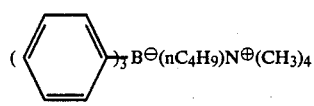

(b)

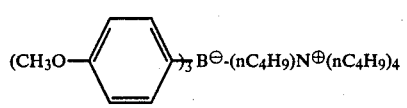

(c)

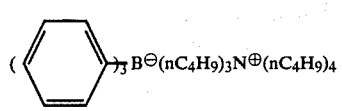

(d)

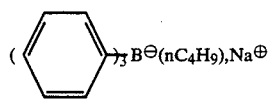

(f)

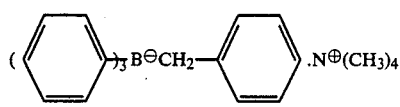

(g)

Suitable organic dyes having no pair anion for the photopolymerization initiator used in the present invention include merocyanine series dyes, coumarin series dyes, and xanthene or thioxanthene dyes.

Examples of merocyanine series dyes are the dyes represented by following formulae (B) and (C);

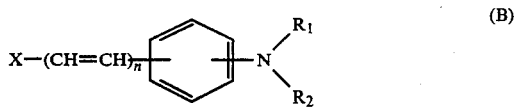

(B)

wherein $R_1$ and $R_2$ each represent a hydrogen atom or an alkyl group having from 1 to 4 carbon atoms, N represents an integer of from 1 to 4, and X represents

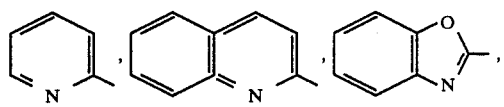

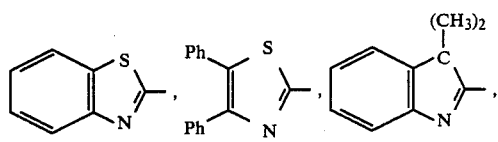

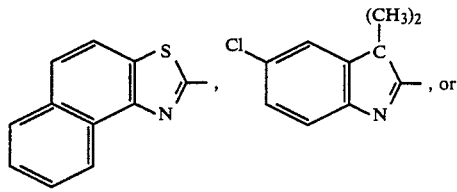

wherein Ph represents a phenyl group;

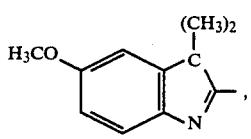

(D)

wherein m represents an integer of from 0 to 4 and

represents
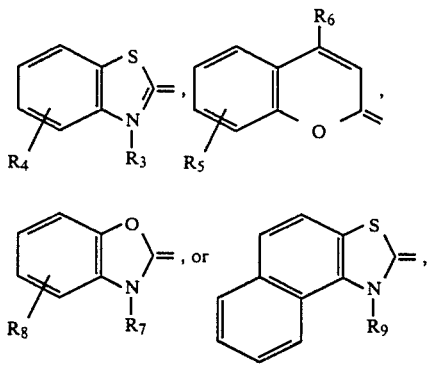
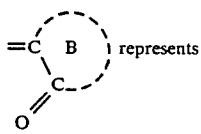 represents
-continued
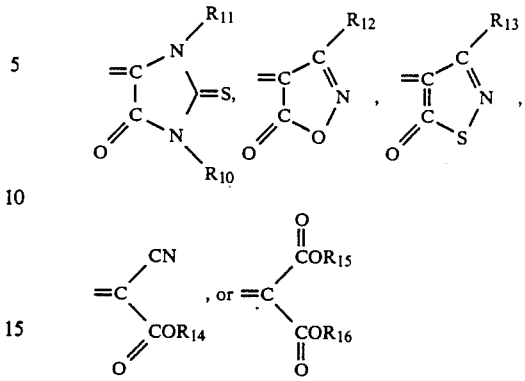
wherein $R_3$ and $R_{16}$ each represents a hydrogen atom, an alkyl group having from 1 to 4 carbon atoms, a phenyl group having from 6 to 12 carbon atoms, or a heterocyclic group.
Specific examples of the merocyanine series dyes are as follows:
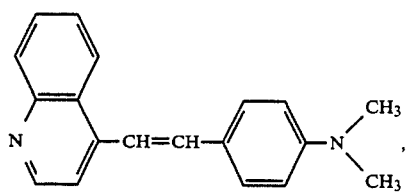
(1)
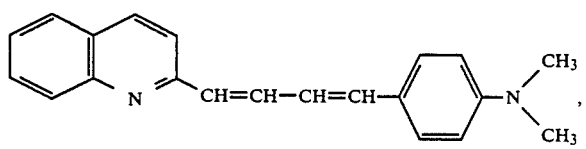
(2)
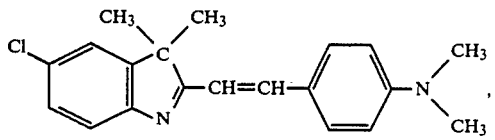
(3)
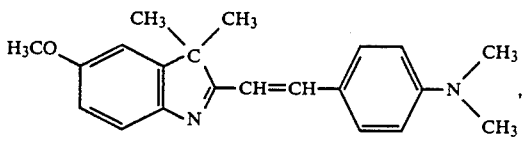
(4)
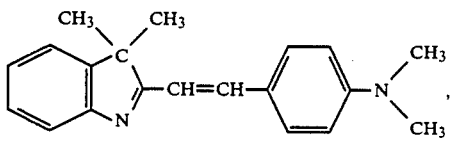
(5)
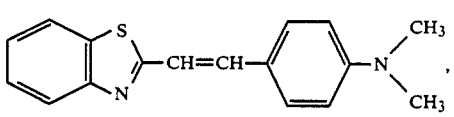
(6)
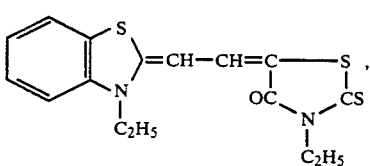
(7)

-continued

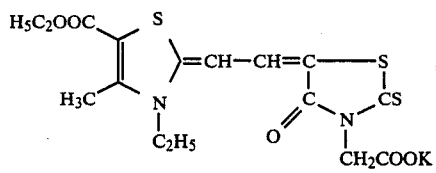 (8)

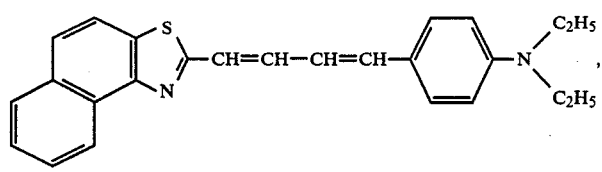 (9)

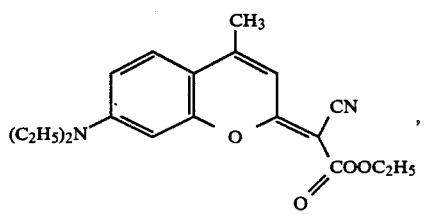 (10)

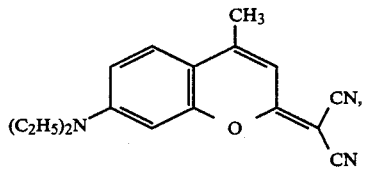 (11)

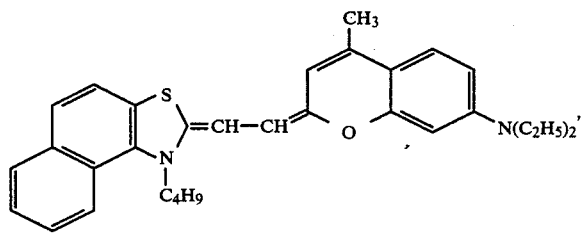 (12)

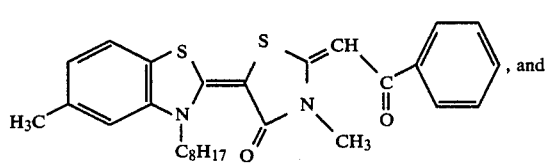 (13) , and

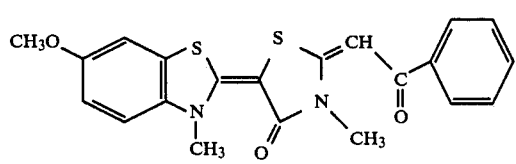 (14)

Examples of coumarin series dyes which can be used in the present invention include the dyes represented by formula (E)

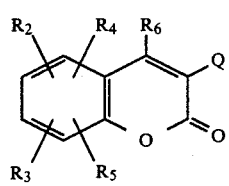 (E)

wherein represents —CN, —$R^1$ or —Z—$R^1$—, wherein $R^1$ represents a substituted or unsubstituted alkyl group having from 1 to 10 carbon atoms, a substituted or unsubstituted alkenyl group having from 1 to 10 carbon atoms, a substituted or unsubstituted alkoxy group, a substituted or unsubstituted aryl group having from 6 to 12 carbon atoms, a substituted or unsubstituted aryloxy group having from 6 to 12 carbon atoms, a substituted or unsubstituted heterocyclic group having from 5 to 15 carbon and hetero atoms constituting the ring, or a hydroxy group, and wherein Z represents a carbonyl group, a sulfonyl group, a sulfinyl group, or an arylenedicarbonyl group; $R^2$, $R^3$, $R^4$, and $R^5$ each independently represents a hydrogen atom, a substituted or unsubstituted alkoxy group having from 1 to 6 carbon atoms, a substituted or unsubstituted alkenyloxy group having from 1 to 6 carbon atoms, a substituted or unsubstituted alkylthio group having from 1 to 6 carbon atoms, a dialkylamino group wherein each alkyl moiety has from 1 to 4 carbon atoms, a hydroxy group, an acyloxy group, a halogen atom, a nitro group, or a 5- or 6-membered heterocyclic group; two or three of said $R^2$, $R^3$, $R^4$, and $R^5$ may form a condensed ring or condensed ring system together with the carbon atoms constituting the ring to which said $R^2$ to $R^5$ are bonded, each ring thereof being a 5- or 6-membered ring and $R_6$ represents a hydrogen atom, a substituted or unsubstituted alkyl group having from 1 to 4 carbon atoms, or a substituted or unsubstituted aryl group having from 6 to 12 carbon atoms. Specific examples of useful coumarin series dyes include;

3-benzoyl-5,7-dimethoxycoumarin,
3-benzoyl-7-methoxycoumarin,
3-benzoyl-6-methoxycoumarin,
3-benzoyl-8-ethoxycoumarin,
7-methoxy-3-(p-nitrobenzoyl)coumarin,
3-benzoylcoumarin,
3-(p-nitrobenzoyl)coumarin,
3-benzoylbenzo[f]coumarin,
3,3'-carbonylbis(7-methoxycoumarin),
3-acrtyl-7-methoxycoumarin,
3-benzoyl-6-bromocoumarin,
3,3'-carbonylbiscoumarin,
3-benzoyol-7-dimethylaminocoumarin,
3,3'-carbonylbis(7-diethylaminocoumarin),
3-carboxycoumarinm,
3-carboxy-7-methoxycoumarin,
3-ethoxycarbonyl-6-methoxycoumarin,
3-ethoxycarbonyl-7-methoxycoumarin,
3-acetylbenzol[f]coumarin,
3-(1-adamantoyl)-7-methoxycoumarin,
3-benzoyl-7-hydroxycoumarin,
3-benzoyl-6-nitrocoumarin,
3-benzoyl-7-acetocoumarin,
3-benzoyl-7-diethylaminocoumarin,
7-dimethylamino-3-(4-iodobenzoyl)coumarin,
7-diethylamino-3-(4-iodobenzoyl)coumarin,
7-diethylamino-3-(4-diethylaminobenzoyl)coumarin,
7-methoxy-3-(4-methoxybenzoyl)coumarin,
3-(4-nitrobenzoyl)benzo[f]coumarin,
3-(4-ethoxycynnamoyl)-7-methoxycoumarin,
3-(4-dimethylaminocynnamoyl)coumarin,
3-(4-diphenylaminocynnamoyl)coumarin,
3-[(3-methylbenzothiazol-2-iridene)acetyl]courmarin,
3-[(1-methylnaphto[1,2-d]thiazol-2-iridene)acetyl]coumarin,
3,3'-carbonylbis(6-methoxycoumarin),
3,3'-carbonylbis(7-methoxycoumarin),
3,3'-carbonylbis!7-dimethylaminocoumarin).
3,3'-carbonylbis(5,7-diisopropoxycoumarin),
3,3'-carbonylbis(5,7-di-n-propoxycoumarin),
3,3'-carbonylbis(5,7-di-n-butoxycoumarin),
3-cyano-6-methoxycoumarin,
3-cyano-7-methoxycoumarin,
7-methoxy-3-phenylsulfonylcoumarin,
7-methoxy-3-phenylsulfinylcoumarin,
1,4-bis(7-diethylamino-3-coumarilcarbonyl)-benzene,
7-diethylamino-5',7'-dimethoxy-3,3'-carbonylbiscoumarin,
7-dimethylamino-3-thenoylcoumarin,
7-diethylamino-3-furoylcoumarin,
7-diethylamino-3-thenoylcoumarin,
3-benzoyl-7-(1-pyrrolidinyl)coumarin,
5,7,6'-trimethoxy-3,3'-carbonylbiscoumarin,
5,5,7'-trimethoxy-3,3'-carbonylbiscoumarin,
7-diethylamino-6'-methoxy-3,3'-carbonylbiscoumarin,
3-nicotinoyl-7-methoxycoumarin,
3-(2-benzofuranylcarbonylk)-7-methoxycoumarin,
3-(7-kmethoxy-3-coumarinoyl)-1-methylpyrimidium fluorosulfate,
3-(5,7-diethoxy-3-coumarinoyl)-1-methylpyridimidium fluoroborate,
N-(7-methoxy-3-coumarinoylmethyl)pyridinium bromide,
9-(7-diethylamino-3-coumarinoyl)-1,2,4,5-tetrahydro-3H,6H,10H[1]benzopyrano[a,9a,1-gh]quinolazin-10-one,
3-acetyl-7-diethylaminocoumarin,
3-acetyl-5,7-dimethoxycoumarin,
7-diethylamino-3-(4-dimethylaminocinnamoyl)coumarin,
7-diethylamino-3-(4-diphenylaminocinnamoyl)coumarin,
7-diethylamino-3-(4-dimethylaminocinnamyl)coumarin,
7-diethylamino-3-(4-dimethylaminocinnamylideneacetyl)coumarin,
7-diethylamino-3-(4-diphenylaminocinnamylideneacetyl)coumarin,
5,7-dimethoxy-3-(4-dimethylaminocinnamoyl)coumarin
5,7-dimethoxy-3-(4-diphenylaminocinnamoyl)coumarin
5,7-dimethoxy-3-(4-dimethylaminocinnamylideneacetyl)coumarin
5,7-dimethoxy-3-(4-diphenylaminocinnamylideneacetyl)coumarin
7-diethylamino-3-[3-(9-dijulolidyl)acryloyl}coumarin
5,7-dimethoxy-3-{3-(9-dijulolidyl)acryloyl}coumarin
3,3'-carbonylbis(7-diethylaminocoumarin),
3,3'-carbonylbis(5,7-dimethoxydicoumarin),
3,3'-carbonylbis(benzo[f]coumarin),
3-benzothiazole-7-diethylaminocoumarin,
3-benzimidazole-7-diethylaminocoumarin, and
3-benzoxazole-7-diethylaminocoumarin Examples of xanthene or thioxanthene series dyes which can be used in the present invention include the dyes represented by formula (F)

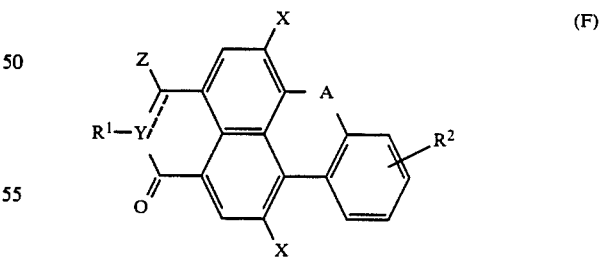

wherein A represents an oxygen atom or sulfur atom; X represents a hydrogen atom or a halogen atom; Y represents a carbon atom or a nitrogen atom wherein when Y is a carbon atoms, the bond between the adjacent carbon atom (the portion shown by the dotted line) is a double bond and when Y is a nitrogen atom, the bond between the adjacent carbon atom is a single bond; Z represents an oxygen atom (in this case, the bond between the adjacent carbon atoms is a double bond), a lower alkoxy group, or a lower alkanonyloxy group;

$R^1$ represents a lower alkyl group, a hydroxy lower alkyl group, a lower alkoxy lower alkyl group, a di-lower alkylamino lower alkyl group, or an aryl group; and $R^2$ represents a lower alkoxy group or a di lower alkylamino group, in addition, said Z and $R^1$ may combine with each other to form

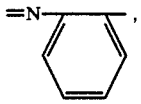

as $-Z-R^1-$.

Specific examples of the halogen atom shown by X are chlorine and bromine. Specific examples of the lower alkoxy group shown by Z are methoxy, ethoxy, and propoxy; and specific examples of the lower alkanoyloxy group shown by Z are acetyloxy and propionyloxy.

Specific examples of the lower alkyl group shown by $R^1$ are methyl, ethyl, propyl, butyl, pentyl, hexyl, heptyl, octyl, nonyl, and decyl, specific examples of the hydroxy lower alkyl group shown by $R^1$ are hydroxymethyl, hydroxyethyl, hydroxypropyl, and hydroxybutyl. Specific examples of the lower alkoxy lower alkyl group shown by $R^1$ are methoxymethyl, methoxyethyl, methoxypropyl, ethoxyethyl, ethoxypropyl, ethoxybutyl, propoxyethyl, and propoxypropyl. Specific examples of the di lower alkylamino lower alkyl group shown by $R^1$ are dimethylaminomethyl; dimethylaminoethyl, dimethylaminopropyl, diethylaminoethyl, diethylaminopropyl, and diethylaminobutyl and specific examples of the aryl group shown by $R^1$ are phenyl, xylyl, tolyl, and naphthyl.

Also, specific examples of the lower alkoxy group shown by $R^2$ are methoxy, ethoxy, and propoxy and specific examples of the di lower alkylamino group shown by $R^2$ are dimethylamino and diethylamino.

The photosensitivity of the photopolymerizable composition of the present invention can further be ensured by incorporating (c) at least one compound selected from the group consisting of (1) a compound having a carbon-halogen bond, (2) an aromatic onium salt, (3) an organic peroxide, and (4) a thio compound represented by formula (II) or (II′):

 (II)

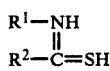 (II′)

wherein $R^1$ represents an alkyl group, an aryl group or a substituted aryl group; and $R^2$ represents a hydrogen atom or an alkyl group; or $R^1$ and $R^2$ are taken together to form a non-metallic atomic group, which may contain a heteroatom selected from oxygen, sulfur, and nitrogen atoms, necessary for forming a 5- to 7-membered ring or a 5- to 7-membered heterocyclic ring, and/or (d) a compound represented by formula (III):

 (III)

wherein $R^1$ and $R^2$ each represents a hydrogen atom or an alkyl group, or $R^1$ and $R^2$ are connected to each other to form an alkylene group; and Ar represents an aromatic group represented by formula:

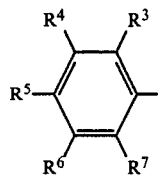

or formula:

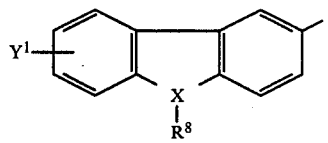

wherein $R^3$, $R^4$, $R^5$, $R^6$, and $R^7$, which may be the same or different, each represents a hydrogen atom, a halogen atom, an alkyl group, an alkenyl group, an aryl group, a substituted aryl group, a hydroxyl group, an alkoxy group a substituted alkoxy group, $-S-R^9$, $-SO-R^9$ or $-SO_2R^9$, provided that at least one of $R^3$, $R^4$, $R^5$, $R^6$, and $R^7$ represents $-S-R^9-$, $-SO-R^9$ or $-SO_2R^9$, wherein $R^9$ represents an alkyl group or an alkenyl group; $R^8$ represents a hydrogen atom, an alkyl group or an acyl group; and $Y^1$ represents a hydrogen atom or

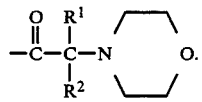

The compound having a carbon-halogen bond as component (c) includes s-triazines having a trihalogenomethyl group (e.g., trichloromethyl), oxadiazoles having a trihalogenomethyl group, 6-trihalogenomethyl-2-pyrones, carbonylmethylene heterocyclic compounds having a trihalogenomethyl group, 4-halogeno-5-(trihalogenomethylphenyl)oxazoles, and 2-(trihalogenomethylphenyl)-4-halogenoxazoles. Specific examples of these compounds are described, e.g., in U.S. Pat. Nos. 3,954,475, 4,447,588, 4,619,998, 4,212,970, and 4,279,982. Of these preferred are s-triazines having a trihalogenomethyl group as represented by formula (IV):

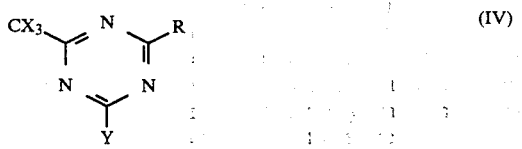 (IV)

wherein X represents a halogen atom; Y represents —CX₃, —NH₂, —NHR', —N(R')₂ or —OR' wherein R' represents an alkyl group, a substituted alkyl group, an aryl group, or a substituted aryl group; and R represents —CX₃, an alkyl group, a substituted alkyl group, an aryl group, a substituted aryl group, or a substituted alkenyl group. Such a compound is described in Wakabayashi et al., *Bull. Chem. Soc. Japan*, 42, 2924 (1969). Specific examples of the compound include 2-phenyl-4,6-bis(tichloromethyl)-s-traizine, 2-(p-chlorophenyl)-4,6-bis(trichloromethyl)-s-triazine, 2-(p-tolyl)-4,6-bis(trichloromethyl)-s-triazine, 2-(p-methoxyphenyl)-4,6-bis(trichloromethyl)-s-triazine, 2-(2',4'-dichlorophenyl)-4,6-bis(trichloromethyl)-s-triazine, 2,4,6-tris(trichloromethyl)-s-triazine, 2-methyl-4,6-bis(-trichloromethyl)-s-triazine, 2-n-nonyl-4,6 -bis(trichloromethyl)-5-triazine, and 2-(α.α.β-trichloroethyl)-4,6-bis(trichloromethyl)-s-triazine.

Other examples of the compound represented by formula (I) include the compounds described in British Patent No. 1,388,492, such as 2-styryl-4,6-bis(trichloromethyl)-s-traizine, 2-(p-methylstyryl)-4,6-bis(trichloromethyl)-s-traizine, 2-(p-methoxystyryl)-4,6-bis(-trichloromethyl)-s-traizine, and 2-(p-methoxystyryl)-4-amino-6-trichloromethyl-s-traizine; and the compound described in Japanese Patent Application (OPI) No. 133428/78 corresponding to British Patent No. 1,602,903, such as 2-(4-methoxy-naphtho-1-yl)-4,6-bis-trichloromethyl-s-triazine, 2-(4-ethoxy-naphtho-1-yl)-4,6-bis-trichloromethyl-s-triazine, 2-[4-(2-ethoxyethyl)-naphtho-1-yl]-4,6-bis-trichloromethyl-s-triazine, 2-(4,7-dimethoxy-naphtho-1-yl)-4,6-bis-trichloromethyl-s-triazine, and 2-(acenaphtho-5-yl)-4,6 -bistrichloromethyl-s-triazine.

Even further examples thereof include the compounds described in German Patent No. 3,337,024 corresponding to U.S. Pat. No. 4,619,998.

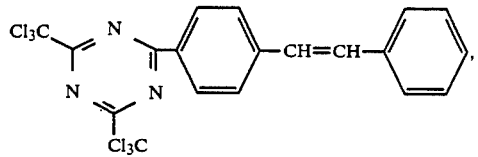

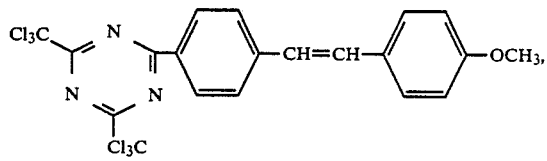

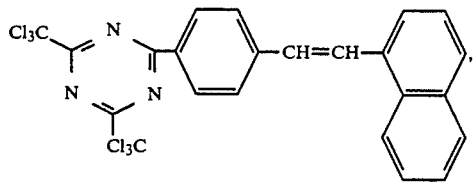

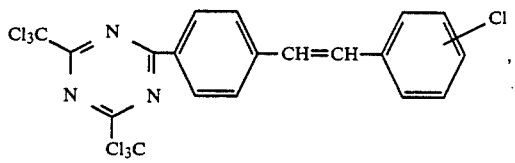

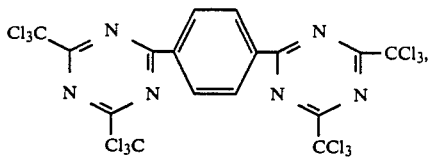

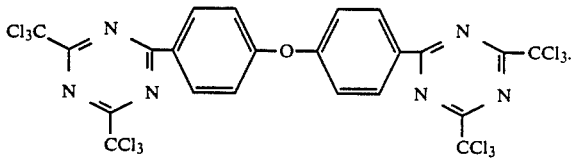

Further examples are those described in British Patent No. 2,195,121, such as

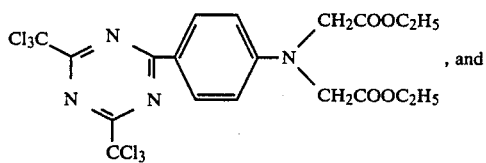

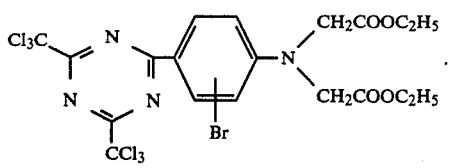

Still other examples of the compound represented formula (IV) are as follows:

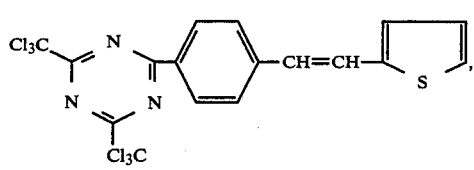

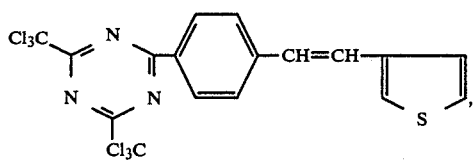

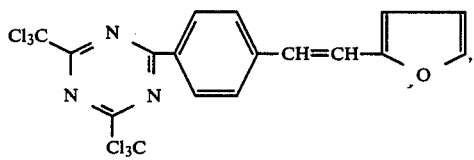

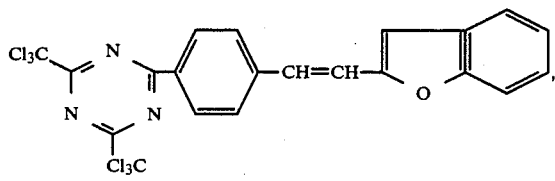

Also example of the aforesaid compound are those described in F. C. Schaefer et al., *Journal of Organic Chemistry*, 29, 1527 (1964), such as 2-methyl-4,6-bis(tribromomethyl)-s-triazine, 2,4,6-tris(tribromomethyl)-s-triazine, 2,4,6-tris(dibromomethyl)-s-triazine, 2-amino-4-methyl-6-tribromomethyl-s-triazine, and 2-methoxy 4-methyl-6-trichloromethyl-s-triazine.

Further examples of the aforesaid compound are those compounds described in Japanese Patent Application (OPI) No. 58241/88 corresponding to U.S. Ser. No. 903,711 filed Sept. 5, 1986.

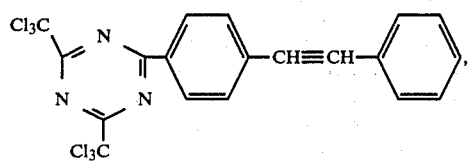

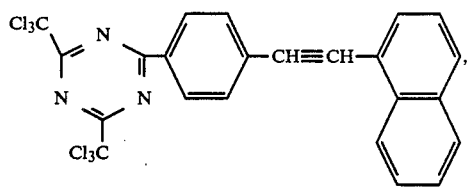

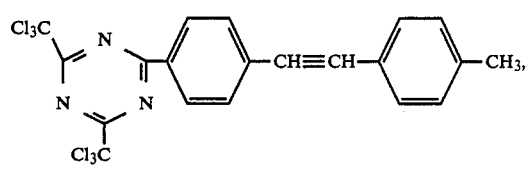

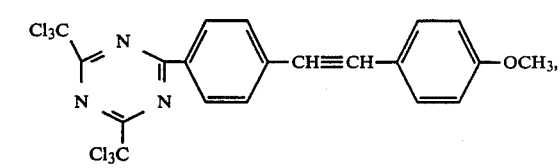

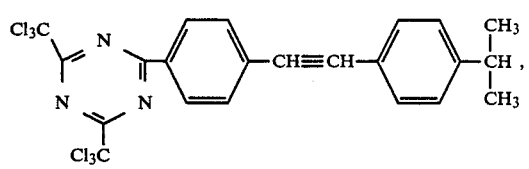

and

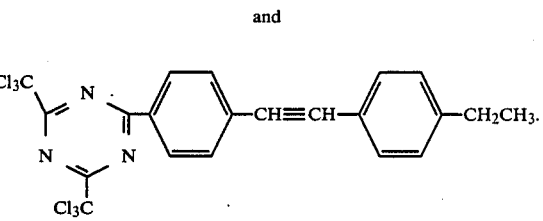

Of the compounds shown by formula (IV) described above, those wherein Y is $-CX_3$, are particularly The aromatic onium salt as component (c) includes c onium salts of the Group V, VI or VII elements, e.g., N, P, As, Sb, Bi, 0, S, Se, Te, and I. specific examples of these aromatic onium salts are described in British Patent Nos. 1,512,981, 1,512,982, 1,516,511, 1,516,512, 1,516,351, and 1,516,352. Preferred of these aromatic onium salts are $BF_4$ salts and $PF_6$ salts. More preferred are:

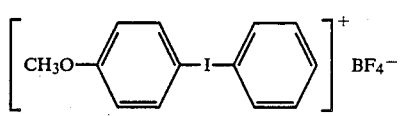

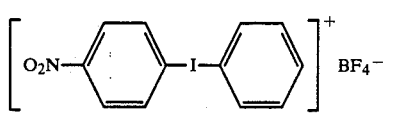

-continued

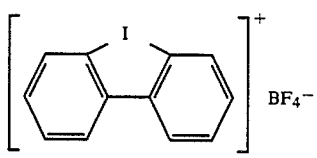

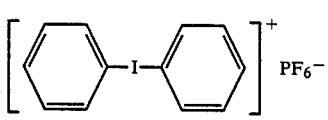

The organic peroxide as component (c) includes almost all of organic compounds having at least one oxygen-oxygen bond per molecule. Specific examples are described in No. EP-A-196561 and 126541. Preferred of them are ester peroxides, e.g., 3,3′,4,4′-tetra(t-butylperoxycarbonyl)benzophenone, 3,3′,4,4′-tetra(t-amylperoxycarbonyl)benzophenone, 3,3′,4,4′-tetra(t-hexylperoxycarbonyl)benzophenone, 3,3′,4,4′-tetra(t-octylperoxycarbonyl)benzophenone, 3,3′,4,4′-tetra(t-cumylperoxycarbonyl)benzophenone, 3,3′,4,4′-tetra(p-isopropylcumylperoxycarbonyl)benzophenone, and di-t-butyldiperoxyisophthalate.

In formulae (II) and (II′) representing the thio compounds as component (c), the alkyl group as represented by $R^1$ preferably contains from 1 to 4 carbon atoms. The aryl group as represented by $R^1$ preferably contains from 6 to 10 carbon atoms and includes phenyl and naphthyl groups. The substituted aryl group includes the above-described aryl groups substituted with a halogen atom (e.g., chlorine), an alkyl group (e.g., methyl) or an alkoxy group (e.g., methoxy and ethoxy). Specific examples of the thio compound of formula (II) or (II′) are listed below.

| Compound Nos. | R1 | R2 |
|---|---|---|
| 1 | —H | —H |
| 2 | —H | —CH₃ |
| 3 | —CH₃ | —H |
| 4 | —CH₃ | —CH₃ |
| 5 | —C₆H₅ | —C₂H₅ |
| 6 | —C₆H₅ | —C₄H₉ |
| 7 | —C₆H₄Cl | —CH₃ |
| 8 | —C₆H₄Cl | —C₄H₉ |
| 9 | —C₆H₄—CH₃ | —C₄H₉ |
| 10 | —C₆H₄—OCH₃ | —CH₃ |
| 11 | —C₆H₄—OCH₃ | —C₂H₅ |
| 12 | —C₆H₄—OC₂H₅ | —CH₃ |
| 13 | —C₆H₄—OC₂H₅ | —C₂H₅ |
| 14 | —C₆H₄—OCH₃ | —C₄H₉ |
| 15 | —(CH₂)₃— | |
| 16 | —(CH₂)₂—S— | |
| 17 | —CH(CH₃)—CH₂—S— | |
| 18 | —CH₂—CH(CH₃)—S— | |
| 19 | —C(CH₃)₂—CH₂—S— | |
| 20 | —CH₂—C(CH₃)₂—S— | |
| 21 | —(CH₂)₂—O— | |
| 22 | —CH(CH₃)—CH₂—O— | |
| 23 | —C(CH₃)₂—CH₂—O— | |
| 24 | —CH=CH—N(CH₃)— | |
| 25 | —(CH₂)₃—S— | |
| 26 | —(CH₂)₂—C(CH₃)₂—S— | |
| 27 | —(CH₂)₃—O— | |
| 28 | —(CH₂)₅— | |
| 29 | —C₆H₄—O— | |
| 30 | —N=C(SCH₃)—S— | |
| 31 | —C₆H₄—NH— | |
| 32 | (4-chloro-2-methylphenoxy group) | |

Specific examples of the compound represented by formula (III) as component (d) are shown below.

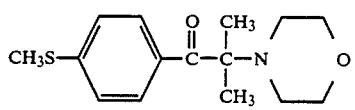

(d-1)

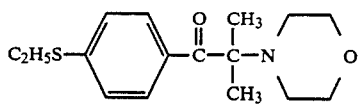

(d-2)

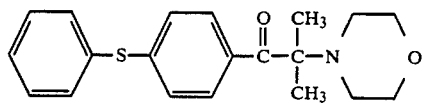

(d-3)

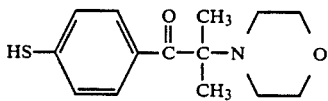

(d-4)

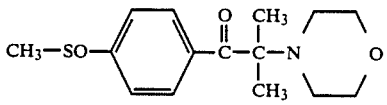

(d-5)

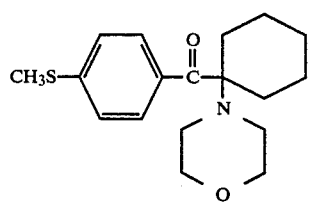 (d-6)

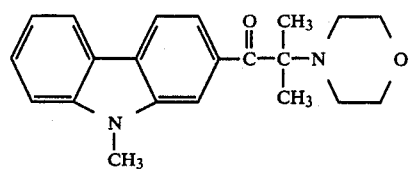 (d-7)

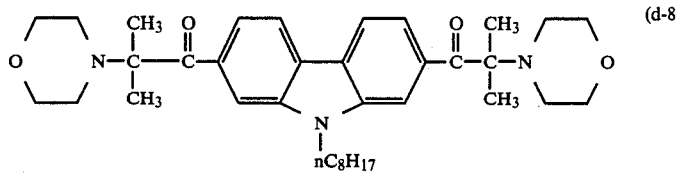 (d-8)

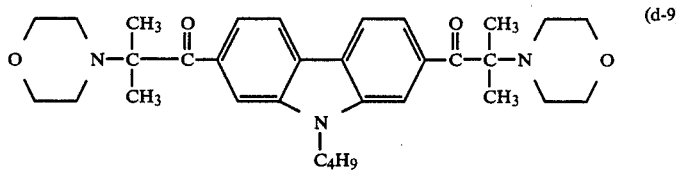 (d-9)

Preferred among these compounds of formula (III) are (d)-1, (d)-2, (d)-8. and (d)-9.

The content of the photopolymerization initiator used in the photopolymerizable composition of the present invention is usually small. If the content is too large, undesirable results such as the interception of the effective light occur. Thus, the amount of photopolymerization initiators used in the present invention should range from about 0.01 to about 60% by weight, and more preferably from 1 to 30% by weight based on the total weight of the photopolymerizable ethylenically unsaturated compound and linear organic high molecular weight polymer if used. The amount of the organic-boron compound (a) represented by formula (I) is 0.05 to 30 parts by weight, preferably 0.1 to 10 parts by weight and most preferably 0.2 to 5 parts by weight, based on 1 part by weight of the organic dye (b).

In the photopolymerization initiator system according to the present invention, the component (a) is suitably used in an amount of from 0.05 to 30 parts, preferably from 0.1 to 10 parts, more preferably from 0.2 to 5 parts, by weight per part by weight of the component (b). In cases where the component (c) is used in combination, it is suitably used in an amount of from 0.01 to 50 parts, preferably from 0.02 to 20 parts, more preferably from 0.05 to 10 parts, by weight per part by weight of the component (b). In cases where the component (d) is used in combination, it is used in an amount of from 0.01 to 50 parts, preferably from 0.02 to 20 parts, more preferably from 0.05 to 10 parts, by weight per part by weight of the component (b).

For the photpolymerizable composition of the present invention, if necessary, various organic amine compounds can be used together, whereby the photopolymerization initiating faculty can be further increased.

Examples of the organic amine compounds are triethanolamine, dimethylamine, diethanolaniline, p-dimethylaminobenzoic acid ethyl ester, and Michler's ketone.

The amount of the organic amine compound which may be added preferably ranges from about 50% by weight to about 200% by weight of the total amount of the photopolymerization initiator.

Furthermore, the photopolymerization initiator used in the present invention may contain, if necessary, a hydrogen donative compound such as N-phenylglycine, and N,N-dialkylbenzoic acid alkyl ester, to further increasing the photopolymerizaiton initiating faculty.

As "linear organic high molecular weight polymer" which may be used in the present invention, any linear organic high molecular weight polymers having compatibility with the aforesaid photopolymerizable ethylenically unsaturated compounds can be, as a matter of course, used without any restriction. However, a linear organic high molecular weight polymer which is soluble in or swellable with water or weak alkaline water, (i.e., can be developed by water or weak alkaline water), is preferably used.

Preferable linear organic high molecular weight polymer has $1 \times 10^3$ to $1 \times 10^6$, and more preferably $5 \times 10^3$ to $5 \times 10^5$ of weight average molecular weight.

The linear organic high molecular weight polymer is used not only as a film-forming agent for the composition but also for development with water, weak alkaline water or an organic solvent developer.

For example, when a water-soluble organic high molecular weight polymer is used, water development becomes possible. Examples of such a linear organic high molecular polymer are addition polymers having carboxylic acid at the side chain, such as those polymers described in Japanese Patent Publication Nos. 34327/79, 25957/79 and 12577/83, Japanese Patent Application (OPI) Nos. 44615/84, 92723/79, 53836/84, and 71048/84. More specifically, methacrylic acid copolymers, acrylic acid copolymers, itaconic acid copolymers, crotonic acid copolymers, maleic acid copolymers, and partially esterified maleic acid copolymers may be used. Other examples thereof include acid cellulose derivatives having carboxylic acid at the side chain. Still further examples include the polymers formed by adding a cyclic acid anhydride to an addition polymer having a hydroxy group. In these polymers, a copolymer of benzyl (meth)acrylate, (meth)acrylic acid, and, if necessary, other addition polymerizable vinyl monomer and a copolymer of allyl (meth)acrylate, (meth)acrylic acid, and, if necessary, other addition polymerizable vinyl monomer are particularly suitable. Examples of other water-soluble linear organic high molecular weight polymers include polyvinylpyrrolidone and polyethylene oxide.

Also, as linear organic high molecular weight polymers for increasing the strength of the hardened film of the composition, polymers such as alcohol-soluble nylon, a polyether of 2,2-bis(4-hydroxyphenyl)propane and epichlorohydrin, are useful.

The linear organic high molecular weight polymers can be incorporated in the photopolymerizable composition in an any optional amount, but if the proportion thereof is over 90% by weight of the composition, the results obtained are undesirable in terms of, for example, the strength of formed images. Thus, the amount of the polymer is preferably from 30 to 85% by weight based on the total weight of the photopolymerizable composition.

Also, the mixing ratio of the photopolymerizable ethylenically unsaturated compound component to the linear organic high molecular weight polymer component is preferably from about 1/9 to about 7/3 by weight ratio, and more preferably from about 3/7 to about 5/5 by weight ratio.

In the present invention, it is also preferable to add small amounts of a heat polymerization inhibitor for inhibiting the occurrence of unnecessary heat polymerization of the polymerizable ethylenically unsaturated compound during the production or storage of the photopolymerizable composition. Examples of suitable heat polymerization inhibitors include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), 2-mercaptobenzoimidazole, and N-nitrosophenylhydroxyamine cerous salt.

The heat polymerization inhibitor is preferably added in an amount of from about 0.01 to about 5% by weight to the total amount of the photopolymerizable composition.

For prevention of polymerization inhibition due to oxygen, higher fatty acid derivative may be added to the composition to be distributed to the surface of the layer by a phase separation occurred during drying. The higher fatty acid derivative is preferably added in an amount of from about 0.5% to about 10% by weight based on the total amount of the composition.

Furthermore, for coloring the photosensitive layer of the composition, a dye or a pigment may be added to the composition. The dye or pigment is preferably added in an amount of from about 0.5% to about 5% by weight based on the total amount of the composition.

Also, for improving the properties of the hardened film or layer of the composition, an inorganic filler or other additives may be added to the composition.

In the case of coating the photopolymerizable composition of the present invention, the composition is dissolved in an organic solvent. Examples of such solvents include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monoethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, and γ-butyrolacetone. These solvents may be used singly or as a mixture thereof.

The concentration of the composition in the coating composition is from about 2 to about 50% by weight as solid components.

The coating amount of the composition ranges preferably from about 0.1 g/m$^2$ to about 10 g/m$^2$, and more preferably from about 0.5 g/m$^2$ to about 5 g/m$^2$ as dry weight.

As a support for the photopolymerizable composition of the present invention, a dimensionally stable plate-form material is preferably used. Examples of dimensionally stable plate-form material include papers, papers laminated with a plastic such as polyethylene polypropylene and polystyrene, plates of a metal such as aluminum (including aluminum alloy), zinc, and copper, films of plastics such as diacetyl cellulose, triacetyl cellulose, cellulose propionate, cellulose butyrate, cellulose acetate butyrate, cellulose nitrate, polyethylene terephthalate, polyethylene, polystyrene, polypropylene, polycarbonate and polyvinyl acetal, and papers or plastic films laminated or vapor deposited with the metals such as those described above.

Of these supports, an aluminum plate is particularly preferred since the plate has high dimensional stability and is inexpensive. Furthermore, a composite sheet composed of a polyethylene terephthalate film having an aluminum sheet thereon such as that described in Japanese Patent Publication No. 18327/73 is also preferred.

In the case of using a metal support having, in particular, aluminum surface, it is preferred that the support is subjected to a surface treatment such as graining treatment, dipping treatment in an aqueous solution of, for example, sodium silicate, potassium fluorozirconate or a phosphate, or an anodic oxidation treatment.

Furthermore, an aluminum plate which is grained and then subjected to a dipping treatment in an aqueous solution of sodium silicate is preferably used in this invention. Also, an aluminum plate subjected to an anodic oxidation treatment and then dipping treatment in an aqueous solution of an alkali metal silicate such as that described in Japanese Patent Publication No. 5125/72 is suitable used. The aforesaid anodic oxidation treatment is carried out by passing electric current in an electrolyte composed an aqueous solution or non-aqueous solution of an inorganic acid (such as phosphoric acid, chromic acid, sulfuric acid), or boric acid), an organic acid (such as oxalic acid, or sulfamic acid), or a salt thereof singly or as a combination of the solutions, using an aluminum plate as the anode.

Also, the application of electodeposition of silicate such as that described in U.S. Pat. No. 3,658,662 is effective in this invention.

Furthermore, a support electrolytically grained such as that disclosed in Japanese Patent Publication No. 27481/71, Japanese Patent Application (OPI) Nos. 58602/77 and 30503/77, which is further subjected to a combined surface treatment of the above-described anodic oxidation treatment and sodium silicate treatment, is also useful.

Also, an aluminum support subjected to mechanical graining, chemical etching, electrolytic graining, anodic oxidation treatment, and further sodium silicate treatment such as that disclosed in Japanese Patent Application (OPI) No. 28893/81 may be used with the present invention.

Still further, an aluminum support which is subjected to the above-described surface treatment or treatments and then under-coated with a water-soluble resin such as polyvinylphosphonic acid, a polymer or a copolymer having a sulfonic group at the side chain, polyacrylic acid, a water-soluble metal salt (e.g., zinc borate), a yellow dye, and/or an amine may be used.

The above hydrophilic treatment is applied for imparting a hydrophilic property to the surface of the support as well as for preventing the occurrence of a harmful reaction of the photopolymerizable composition formed thereon and for improving the adhesion of the photosensitive layer formed thereon.

On the layer of the photopolymerizable composition formed on the support, a protective layer composed of a polymer having an excellent oxygen intercepting properties, such as polyvinyl alcohol or acid celluloses, may be used to prevent polymerization inhibiting action by oxygen in air. A coating method for forming such a protective layer is described in e.g., U.S. Pat. No. 3,458,311 and Japanese Patent Publication No. 49729/80.

Also, the photopolymerizable composition of the present invention can be used for an ordinary photopolymerization reaction. Furthermore, the photopolymerization composition of the present invention can be applied to various fields of arts such as photoresists for making printing plates and printed plate boards. In particular, by the high sensitivity and the wide spectral sensitivity characteristics of the photopolymerizable composition of this invention, good results are obtained when the composition is applied for the photosensitive materials for a visible laser such as an argon laser.

When a light-sensitive printing plate using the photopolymerizable composition as the photosensitive layer is imagewise exposed and the unexposed portions of the photosensitive layer are removed by a developer, images are obtained.

As the developer preferably used for making a lithographic printing plate by developing the photosensitive layer composed of the photopolymerizable composition formed on a support, developers such as these described in Japanese Patent Publication No. 7427/82 may be used. Specific examples of such preferred developers include an aqueous solution of an inorganic alkali such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium hydrogencarbonate, and an aqueous ammonia, and an aqueous solution of an organic alkali such as monoethanol amine, diethanol amine. The concentration of the alkaline aqueous solution when used as the developer is from about 0.1 to about 10% by weight, and preferably from 0.5 to 5% by weight.

Also, the alkaline aqueous solution may, if necessary, contain a small amount of a surface active agent and an organic solvent such as benzyl alcohol, 2-phenoxy ethanol, and 2-butoxy ethanol, as described in e.g., U.S. Pat. Nos. 3,375,171 and 3,615,480.

Furthermore, the developers described in Japanese Patent Application (OPI) Nos. 26601/75 and 54341/83, and Japanese Patent Publication Nos. 39464/81 and 42860/81 are also excellent when used as the developer for the aforesaid purposes.

The photopolymerizable composition of the present invention has high sensitivity for active light having a wide wave-length region of ultraviolet rays to visible light. Accordingly, the light source for the composition may be e.g., a super high pressure, high pressure, intermediate pressure, or low pressure mercury lamp, a chemical lamp, a carbon arc lamp, a xenon lamp, a metal halide lamp, visible and ultraviolet various laser lamps, a fluorescent lamp, a tungsten lamp, or sun light.

In the interest of brevity and conciseness, the contents of the aforementioned numerous patents and articles are hereby incorporated by reference.

The following examples are given by way of illustration and not limitation.

EXAMPLES 1 to 5

After graining the surface of an aluminum plate of 0.30 mm in thickness using a nylon brush and an aqueous suspension of pumice stone of 400 mesh, the surface thereof was washed well with water. The aluminum plate was immersed in an aqueous solution of 10% sodium hydroxide for performing etching for 60 seconds at 70° C., washed with running water, neutralized and washed with an aqueous solution of 20% nitric acid, and then washed with water. The aluminum plate was then subjected to an electrolytic graining treatment in an aqueous solution of 1% nitric acid using an alternating electric current of sine wave under the condition of 12.7 volts($V_A$) at an anodic electric quantity of 160 coulombs/dm$^2$. The surface roughness was 0.6 μm (shown by Ra). Thereafter, the plate was immersed in an aqueous solution of 30% sulfuric acid for performing desmatting for 2 minutes at 55° C. and then subjected to an anodic oxidation treatment in an aqueous solution of 20% sulfuric acid at an electric current density of 2 amp./dm$^2$ so that the coverage of the anodic oxidation layer became 2.7 g/m$^2$.

On the aluminum plate thus treated was coated a photosensitive composition having the composition shown below at a dry coverage of 1.4 g/m$^2$ and dried for 2 minutes at 80° C. to form a photosensitive layer.
Trimethylolpropane Tri(acryloyloxypropyl) Ether: 2.0 g
Allyl methacrylate/Methacrylic acid Copolymer (copolymerization ration of 80/20 by mole ratio): 2.0 g
Photopolymerization Initiator (shown in Table 1)
Fluorine Series Nonionic Surface Active Agent (Fluorad FC-430, trade name, made by 3M Co.): 0.03 g
Methyl Ethyl Ketone: 20 g
Propylene Glycol Monomethyl Ether Acetate: 20 g On the photosensitive layer thus formed was coated an aqueous solution of 3% by weight polyvinyl alcohol (having a saponification degree of 86.5 to 89 mole % and a polymerization degree of 1,000) at a dry coverage of 2 g/m² and dried for 2 minutes at 100° C. to form an oxygen intercepting layer.

The photosensitivity test at visible light was performed using a monochromatic visible light having a wavelength of 488 nm. The monochromatic light of 488 nm. was obtained by passing light of a tungsten lamp through Kenko Optical Filter BP49. The sensitivity measurement was performed using Fuji PS Step Guide (made by Fuji Photo Film Co., a step tablet of the transparent optical density at the initial state of 0.05 with increasing of 0.15 each step up to 15 stages). The sensitivity was shown by the clear state number of the PS step guide at the exposure of 120 seconds with the illuminance of 25 lux at the surface portion of the photosensitive layer to evaluate sensitivity.

The development was performed by immersing the plate in a developer having the following composition for one minute at 25° C.
Potassium Silicate (having about 2.1 of a molar ratio of $SiO_2/K_2O$): 30 g
Potassium Hydroxide: 15 g

| | |
|---|---|
| Potassium Silicate (having about 2.1 of a molar ratio of $SiO_2/K_2O$) | 30 g |
| Potassium Hydroxide | 15 g |
| 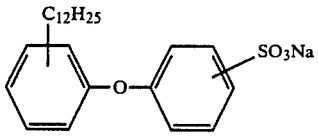 | 3 g |
| Water | 1000 g |

The measured sensitivities obtained which reflect the effects resulted from changing the photopolymerization initiator are shown in Table 1 below.

TABLE 1

| | Photopolymerization Initiator | | Clear Stage No. (Stage) |
|---|---|---|---|
| Example 1 | 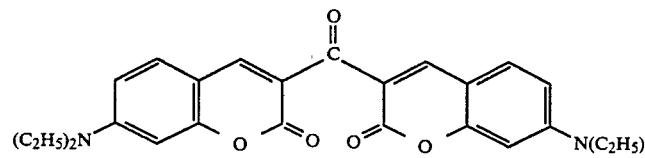 | 0.1 g | 8.4 |
| | 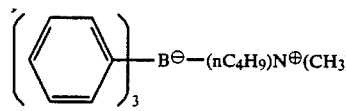 | 0.1 g | |
| Example 2 | 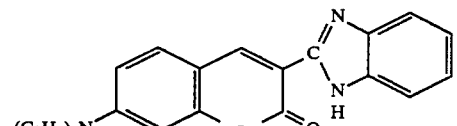 | 0.1 g | 7.4 |
| | 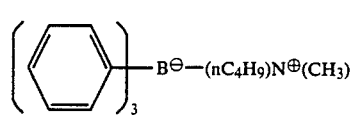 | 0.1 g | |
| Example 3 | 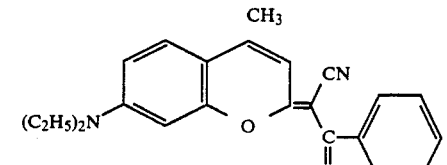 | 0.1 g | 2.3 |
| | 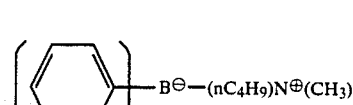 | 0.1 g | |

TABLE 1-continued
| | Photopolymerization Initiator | | Clear Stage No. (Stage) |
|---|---|---|---|
| Example 4 | 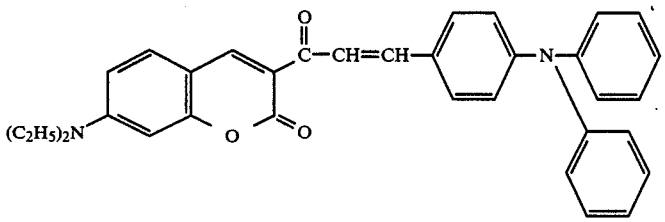 | 0.1 g | 7.7 |
| | 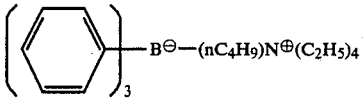 | 0.1 g | |
| Example 5 | 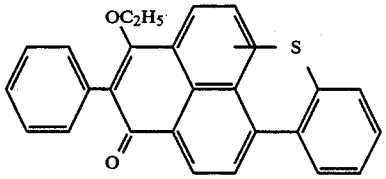 | 0.1 g | 2.6 |
| | 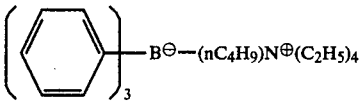 | 0.1 g | |
| Comparison Example 1 | 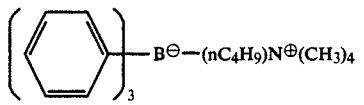 | 0.1 g | No Image formed |
| Comparison Example 2 | 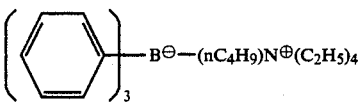 | 0.1 g | No Image formed |
| Comparison Example 3 | 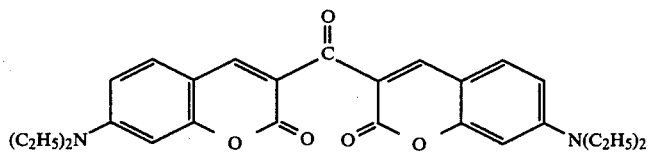 | 0.1 g | No Image formed |
| Comparison Example 4 | 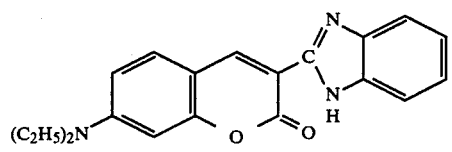 | 0.1 g | No Image formed |
| Comparison Example 5 | 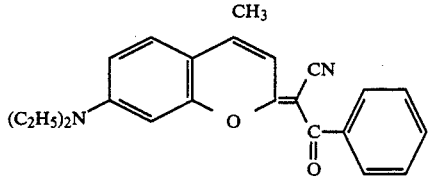 | 0.1 g | No Image formed |

TABLE 1-continued

| | Photopolymerization Initiator | | Clear Stage No. (Stage) |
|---|---|---|---|
| Comparison Example 6 | 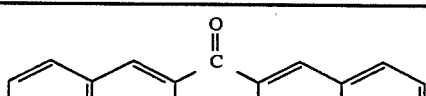 | 0.1 g | No Image formed |
| Comparison Example 7 | 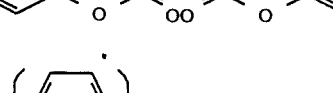 | 0.1 g | No Image formed |

As is shown in the above Table, it can be seen that the samples representing the present invention i.e., Examples 1 to 5, have far higher sensitivity than the samples in Comparison Examples 1 to 7.

EXAMPLES 6 and 7

By following the same procedure for preparing the aluminum support as in Example 1 except that rather than subjecting the aluminum plate to an anodic oxidation treatment in an aqueous solution of 20% sulfuric acid, the aluminum plate was subjected to an anodic oxidation treatment in an aqueous solution of 5% phosphoric acid for 2 minutes at a current density of 2 amp./dm² so that the coverage of the anodic oxidation layer became 0.8 g/m², and then treated on an aqueous solution of 3% sodium silicate for 10 seconds at 70° C. Then, the coating composition having the following formulation was coated on the aluminum plate to form a photosensitive layer.

Coating Composition

Pentaerythritol Tetraacrylate: 1.5 g
Benzyl Methacrylate/Methacrylic Acid Copolymer (copolymer ratio 65/35 by mole ratio): 3.0 g
Photopolymerization Initiator (shown in Table 2)
Copper Phthalocyanine Pigment: 0.2 g
Fluorine Series Nonionic Surface Active Agent (Fluorad FC-340, trade name, made by 3M Co.): 0.03 g
Methyl Ethyl Ketone: 20 g
Propylene glycol Monomethyl Ether Acetate: 20 g The dry coverage of the photosensitive layer was 1.5 g/m². Also, by following the same manner as in Example 1, an oxygen intercepting layer composed of polyvinyl alcohol was formed on the photosensitive layer. The light exposure was performed using a printer FT 26V2 UPNS, made by Nuarc Co., in the United States (light source: 2 KW metal halide lamp) at 3 counts from a distance of 1 meter. The sensitivity measurement was performed by using the same step guide as in Example 1 and the development was performed by immersing the plate in a developer having the following formulation (described in Japanese Patent Publication No. 42860/81):

Sodium Sulfite: 3 g
Benzyl Alcohol: 30 g
Triethanolamine: 20 g
Monoethanolamine: 5 g
Pelex NBL (sodium t-butylnaphthalenesufonate, made by Kao Atlas Co.): 30 g
Water: 1000 g for 1 minute at 25° C. to remove the unexposed portions.

The results in terms of sensitivity illustrating the effect of changing the photopolymerization initiators are set forth in Table 2.

TABLE 2

| | Photopolymerization Initiator | | Clear Stage No. (Stage) |
|---|---|---|---|
| Example 6 | 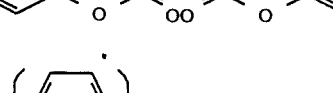 | 0.1 0.1 | 10.2 |

TABLE 2-continued

| Photopolymerization Initiator | | Clear Stage No. (Stage) |
|---|---|---|
| Example 7 [naphthothiazole-benzoyl structure] | 0.1 | 15.5 |
| [(phenyl)$_3$B$^{\ominus}$(nC$_4$H$_9$)N$^{\oplus}$(CH$_3$)$_4$] | 0.1 | |
| Comparison Example 8 [(phenyl)$_3$B$^{\ominus}$(nC$_4$H$_9$)N$^{\oplus}$(CH$_3$)$_4$] | 0.1 | No image formed |
| Comparison Example 9 [bis-benzylidene structure] | 0.1 | 2.0 |
| Comparison Example 10 [naphthothiazole-benzoyl structure] | 0.1 | 4.0 |

As is clear from the results in the above Table, the Samples illustrating the present invention i.e., Examples 6 and 7, have far higher sensitivities than those of Comparison Examples 8 to 10.

EXAMPLES 8 TO 17 AND COMPARATIVE EXAMPLES 11 TO 14

The same procedure of Example 1 was repeated, except for using a photopolymerization initiator system shown in Table 3. The results of photosensitivity test are shown in Table 3.

In addition, sensitivity of each sample to an Ar+ laser beam was measured as follows.

The sample was scanned through an ND filter with a single Ar+ laser beam having a beam diameter of 25 μm at a wavelength of 488 nm (*Model 95-3 manufactured by Lexel Co.) with its intensity being varied. After the development, the width of the reproduced line was measured, and the intensity of the laser beam which afforded a reproduced line width of 25 μm was taken as sensitivity.

TABLE 3

| Photopolymerization Initiator | | Clear Stage No. (Stage) | Ar+ Laser Beam Intensity (MJ/cm) |
|---|---|---|---|
| Example No. | | | |
| 8 [(C$_2$H$_5$)$_2$N—Ar—CH=C—C(=O)—C(OO)—C(=O)—C=CH—Ar—N(C$_2$H$_5$)$_2$] 0.1 g [hereinafter referred to as Compound (b)-13] | | 9.8 | 0.73 |
| [(phenyl)$_3$B$^{\ominus}$(nC$_4$H$_9$)N$^{\oplus}$(nC$_4$H$_9$)$_4$] | | | |

TABLE 3-continued

| | Photopolymerization Initiator | | Clear Stage No. (Stage) | Ar+ Laser Beam Intensity (MJ/cm) |
|---|---|---|---|---|
| | 0.065 g [hereinafter referred to as Compound (a)-4] | | | |

Structure of Compound (c)-28:

CH₃CO—C₆H₄—C(=N—C(CCl₃)=N—N=C(CCl₃))

0.043 g
[hereinafter referred to as Compound (c)-28]

| | | | | |
|---|---|---|---|---|
| 9 | Compound (b)-13 | 0.1 g | 9.2 | 0.89 |
| | Compound (a)-4 | 0.065 g | | |

Structure: Diphenyliodonium hexafluorophosphate (Ph₂I⁺ PF₆⁻)

0.052 g
[hereinafter referred to as Compound (c)-26]

| | | | | |
|---|---|---|---|---|
| 10 | Compound (b)-13 | 0.1 g | 10.2 | 0.65 |
| | Compound (a)-4 | 0.065 g | | |

Structure: Benzophenone tetracarboxylic acid tetra-t-butyl ester (tC₄H₉OOC-/-COOC₄H₉(t) substituted benzophenone)

0.156 g
[hereinafter referred to as Compound (c)-29]

| | | | | |
|---|---|---|---|---|
| 11 | Compound (b)-13 | 0.1 g | 9.1 | 0.94 |
| | Compound (a)-4 | 0065 g | | |

Structure:

$$CH_3-C(=N-N=C-SH)-S$$

0.02 g
[hereinafter referred to as Compound (c)-30]

| | | | | |
|---|---|---|---|---|
| 12 | Compound (b)-13 | 0.1 g | 8.2 | 1.3 |
| | Compound (a)-4 | 0.065 g | | |

Structure: Bis[4-(2-morpholino-2-methylpropionyl)phenyl] with N-octyl bridging (morpholino-C(CH₃)₂-C(=O)-Ar-Ar-C(=O)-C(CH₃)₂-morpholino, with N-nC₈H₁₇ bridge)

0.1 g
[hereinafter referred to as Compound (d)-8]

| | | | | |
|---|---|---|---|---|
| 13 | Compound (b)-13 | 0.1 g | 10.4 | 0.60 |
| | Compound (a)-4 | 0.065 g | | |
| | Compound (d)-8 | 0.1 g | | |
| | Compound (c)-28 | 0.043 g | | |
| 14 | Compound (b)-13 | 0.1 g | 10.1 | 0.67 |
| | Compound (a)-4 | 0.065 g | | |
| | Compound (d)-8 | 0.1 g | | |

TABLE 3-continued

|  | Photopolymerization Initiator |  | Clear Stage No. (Stage) | Ar+ Laser Beam Intensity (MJ/cm) |
|---|---|---|---|---|
|  | Compound (c)-26 | 0.052 g |  |  |
| 15 | Compound (b)-13 | 0.1 g | 10.5 | 0.59 |
|  | Compound (a)-4 | 0.065 g |  |  |
|  | Compound (d)-8 | 0.1 g |  |  |
|  | compound (c)-29 | 0.156 g |  |  |
| 16 | Compound (b)-13 | 0.1 g | 9.7 | 0.77 |
|  | Compound (a)-4 | 0.065 g |  |  |
|  | Compound (d)-8 | 0.1 g |  |  |
|  | Compound (c)-30 | 0.02 g |  |  |
| 17 | Compound (b)-13 | 0.1 g | 7.2 | 1.8 |
|  | Compound (a)-4 | 0.065 g |  |  |
| Comparative Example No. |  |  |  |  |
| 11 | Compound (b)-13 | 0.1 g | 7.0 | 2.0 |
|  | Compound (c)-29 | 0.156 g |  |  |
| 12 | Compound (b)-13 | 0.1 g | 6.8 | 3.1 |
|  | Compound (c)-28 | 0.043 g |  |  |
| 13 | Compound (b)-13 | 0.1 g | 6.7 | 3.2 |
|  | Compound (c)-26 | 0.052 g |  |  |
| 14 | Compound (b)-13 | 0.1 g | No image formed |  |
|  | Compound (c)-30 | 0.02 g |  |  |

It can be seen from the results of Table 3 that the sensitivity can be further increased by incorporating the components (c) and/or the compound (d) to the photopolymerizable composition of the present invention.

While the invention has been described in detail and with reference to specific embodiments thereof, it will be apparent to one skilled in the art that various changes and modifications can be made thereto without departing from the spirit and scope thereof.

What is claimed is:

1. A photopolymerizable composition comprising:
   (i) a polymerizable monomer compound in an amount such that a light-exposed portion thereof will separate from a light-unexposed portion thereof when treated with a developer, said compound having at least one ethylenically unsaturated group, which is capable of being photopolymerized by active light, and
   (ii) a photopolymerization initiator in an amount effective to initiate polymerization of said polymerizable monomer compound wherein said initiator comprises a combination of (a) an organic compound represented by formula (I):

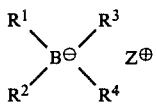

wherein $R^1$, $R^2$, and $R^3$, and $R^4$, which may be the same or different, each represents a substituted or unsubstituted alkyl group, a substituted or unsubstituted aryl group, a substituted or unsubstituted alkenyl group, a substituted or unsubstituted alkenyl group, or a substituted or unsubstituted heterocyclic group, and at least two of said $R^1$, $R^2$, $R^3$, and $R^4$ may combine to form a cyclic structure, with the proviso that at least one of $R^1$, $R^2$, $R^3$, and $R^4$ is an alkyl group, and where $Z\oplus$ represents an alkali metal cation or a quaternatry ammonium cation, and (b) an organic non-ionic dye.

2. The photopolymerizable composition according to claim 1, wherein the organic non-ionic dye is selected from the group consisting of merocyanine dyes, coumarin dyes and xanthene or thioxanthene dyes.

3. A photopolymerizable composition according to claim 1, wherein the organic non-ionic dye is selected from the group consisting of merocyanine dyes.

4. A photopolymerizable composition according to claim 2, wherein the organic non-ionic dye is selected from the group consisting of courmarin dyes.

5. A photopolymerizable composition according to claim 2, wherein the organic non-ionic dye is a xanthene or thioxanthene dye.

6. A photopolymerizable composition according to claim 1, wherein said polymerizable monomer compound is selected from the group of esters of unsaturated carboxylic acids and aliphatic polyhydric alcohol compounds, and amides of unsaturated carboxylic acids and aliphathic polyhydric amine compounds, and mixtures thereof.

7. A photopolymerizable composition according to claim 1 containing from about 5 to about 50% by weight of said polymerizable compound (i).

8. A photopolymerizable composition according to claim 7 containing from about 10 to about 40% by weight of said polymerizable compound (i).

9. A photopolymerizable composition according to claim 1 containing from about 0.01 to about 60% by weight of photopolymerization initiator (ii), based on the total amount of polymerizable compound (i).

10. A photopolymerizable composition according to claim 1 containing from about 1 to about 30% by weight of photopolymerization initiator (ii), based on the total amount of polymerizable compound (i).

11. A photopolymerizable composition according to claim 1, wherein said organic compound represented by formula (I) is present in an amount of from 0.05 to 30 parts by weight per part by weight of the organic non-ionic dye.

12. A photopolymerizable composition according to claim 1, further comprising (iii) a linear organic high molecular weight polymer.

13. A photopolymerizable composition according to claim 12, comprising from about 30 to about 85% by weight based on the total weight of the photopolymerizable composition of said linear high molecular weight polymer (iii).

14. A photopolymerizable composition according to claim 13, wherein the mixing ratio of component (i) to the linear high molecular weight polymer (iii) ranges from about 1/9 to about 7/3 by weight ratio.

15. A photopolymerizable composition according to claim 14, wherein said mixing ratio ranges from about 3/7 to about 5/5 by weight ratio.

16. A photopolymerizable composition according to claim 1 further comprising at least one of an organic amine compound, a hydrogen donative compound and a radical generating agent.

17. A support having coated thereon the composition of claim 1.

18. A coated support according to claim 17 further comprising a protective layer.

19. A support having coated thereon the composition of claims 12.

20. A photopolymerizable composition according to claim 1, wherein said photopolymerization initiator further comprises (c) at least one compound selected from the group consisting of (1) a compound having a carbon-halogen bond, (2) an aromatic onium salt, (3) an organic peroxide, and (4) a thio compound represented by formula (II) or (II'):

  (II)

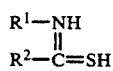  (II')

wherein R¹ represents an alkyl group, an aryl group or a substituted aryl group; and R² represents a hydrogen atom or an alkyl group; or R¹ and R² are taken together to form a non-metallic atomic group, which may contain a heteroatom selected from oxygen, sulfur, and nitrogen atoms, necessary for forming a 5- to 7-membered ring or a 5- to 7-membered heterocyclic ring, and/or (d) a compound represented by formula (III):

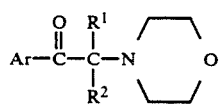  (III)

wherein R¹ and R² each represents a hydrogen atom or an alkyl group, or R¹ and R² are connected to each other to form an alkylene group; and Ar represents an aromatic group represented by formula:

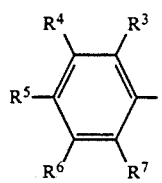

or formula:

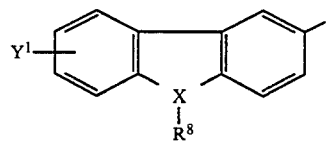

wherein R³, R⁴, R⁵, R⁶, and R⁷, which may be the same or different, each represents a hydrogen atom, a halogen atom, an alkyl group, an alkenyl group, an aryl group, a substituted aryl group, an alkenyl group, an aryl group, a substituted aryl group, a hydroxyl group, an alkoxy group a substituted alkoxy group, —S—R⁹, —SO—R⁹ or —SO₂R⁹, provided that at least one of R³, R⁴, R⁵, R⁶, and R⁷ represents —S—R⁹—, —SO—R⁹ or —SO₂R⁹, wherein R⁹ represents an alkyl group or an alkenyl group; R⁸ represents a hydrogen atom, an alkyl group or an acyl group; and Y¹ represents a hydrogen atom or

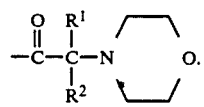

21. A photopolymerizable composition according to claim 20, including a compound having a carbon-halogen bond said compound being an s-triazine having the formula (IV):

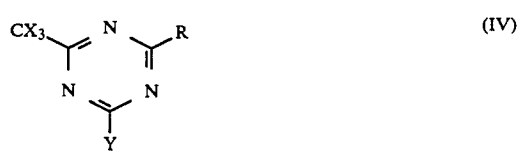  (IV)

wherein X represents a halogen atom; Y represents —CX₃, —NH₂, —NHR', —N(R')₂ or —OR' wherein R' represents an alkyl group, a substituted alkyl group, an aryl group, or a substituted aryl group; and R represents —CX₃, an alkyl group, a substituted alkyl group, an aryl group, a substituted aryl group, or a substituted alkenyl group.

22. A photopolymerizable composition according to claim 20, including an aromatic onium salt which is an aromatic onium salt of N, P, As, Sb, Bi, O, S, Se, Te or I.

23. A photopolymerizable composition according to claim 20, including an organic peroxide selected from the group consisting of:
  3,3',4,4'-tetra(t-butylperoxycarbonyl)benzophenone,
  3,3',4,4'-tetra(t-amylperoxycarbonyl)benzophenone,
  3,3',4,4'-tetra(t-hexylperoxycarbonyl)benzophenone,
  3,3',4,4'-tetra(t-octylperoxycarbonyl)benzophenone,
  3,3',4,4'-tetra(t-cumylperoxycarbonyl)benzophenone,
  3,3',4,4'-tetra(t-isopropylcumylperoxycarbonyl)benzophenone, and di-t-butyldiperoxyisophthalate.

24. A photopolymerizable composition according to claim 20, including a compound represented by the general formula (III) selected from the group consisting of:

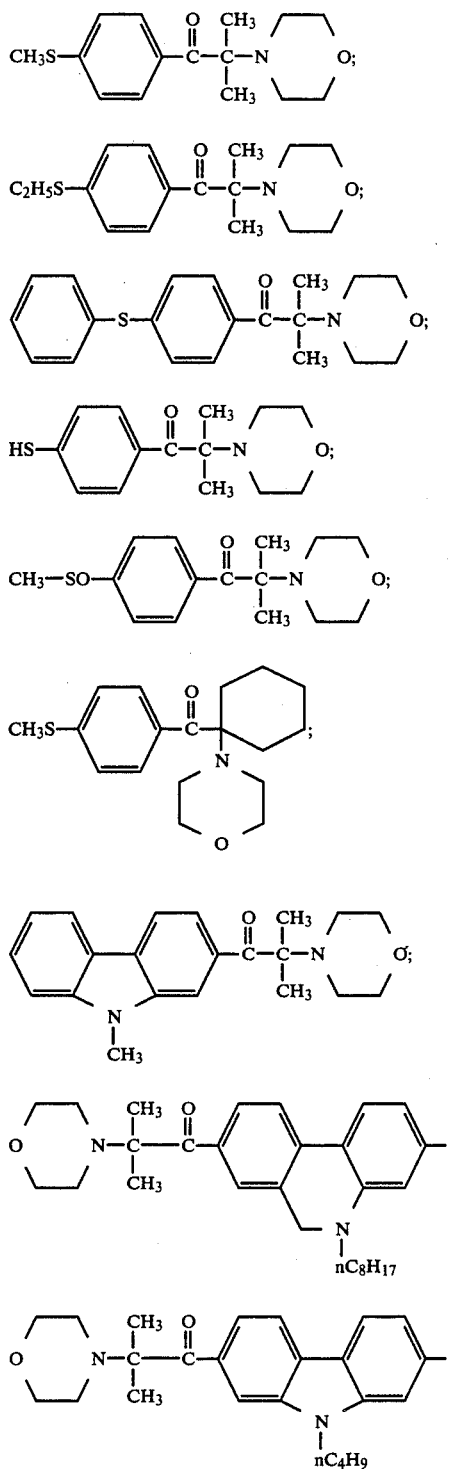

25. A photopolymerizable composition according to claim 20, wherein an amount of the component (c) ranges from 0.01 to 50 parts by weight per one part by weight of component (b).

26. A photopolymerizable composition according to claim 20, including component (d) wherein the amount of component (d) ranges from 0.05 to 10 parts by weight per one part by weight of component (b).

27. A photopolymerizable composition according to claim 20, including compound (d) wherein an amount of component (d) ranges from 0.01 to 50 parts by weight per one part by weight of component (b).

* * * * *